United States Patent [19]
Kwasnick

[11] Patent Number: 5,490,881
[45] Date of Patent: Feb. 13, 1996

[54] MAINTAINING UNIFORMITY OF DEPOSITED FILM THICKNESS IN PLASMA-ENHANCED CHEMICAL VAPOR DEPOSITION

[76] Inventor: Robert F. Kwasnick, 1021 Millington Rd., Schenectady, N.Y. 12309

[21] Appl. No.: 970,201

[22] Filed: Nov. 2, 1992

[51] Int. Cl.$^6$ ................................................. C23C 16/50
[52] U.S. Cl. ............... 118/723 E; 118/728; 118/500; 118/715
[58] Field of Search ....................... 118/728, 500, 118/723 E, 715

[56] References Cited

U.S. PATENT DOCUMENTS

| | | | |
|---|---|---|---|
| 3,645,545 | 2/1922 | Garnache | 118/729 |
| 4,223,048 | 9/1980 | Engle | 118/723 E |
| 4,612,207 | 9/1986 | Jansen | 118/730 |
| 4,767,641 | 8/1988 | Kieser | 118/723 E |
| 4,823,736 | 4/1989 | Post | 118/728 |
| 4,834,022 | 5/1989 | Mahawili | 118/728 |
| 4,993,360 | 2/1991 | Nakamura | 118/728 |
| 5,116,181 | 5/1992 | Severns | 118/730 |

FOREIGN PATENT DOCUMENTS

| | | | |
|---|---|---|---|
| 61-214525 | 9/1986 | Japan | 118/723 E |
| 61-219130 | 9/1986 | Japan | 118/725 |
| 62-189725 | 8/1987 | Japan | 118/723 E |
| 63-119525 | 5/1988 | Japan | 118/723 E |

*Primary Examiner*—Richard Bueker

[57] ABSTRACT

In depositing films upon a plate by use of plasma-enhanced chemical vapor deposition, variations in thickness of the film that normally occur at the edges of the plate are reduced by positioning a frame of tiles around the plate. The frame provides a sacrificial edge at which thickness variations at the edge of the film can occur. After deposition, removal of the frame results in improved uniformity of film thickness on the plate itself.

5 Claims, 7 Drawing Sheets

MAINTAINING UNIFORMITY OF DEPOSITED FILM THICKNESS IN PLASMA-ENHANCED CHEMICAL VAPOR DEPOSITION

This invention concerns reduction of thickness variations which occur near the edge of a plate upon which is formed a thin layer of material by a plasma-enhanced chemical vapor deposition process.

BACKGROUND OF THE INVENTION

Arrays of Transistors Used in Imaging

As known in the art, an array of Field-Effect Transistors (FETs), each having an associated photodiode, is often used, for example, in imaging. The array typically comprises a plate P upon which is formed the array. Large FET arrays are also used in active-matrix liquid-crystal displays.

Problem in Manufacturing the Arrays

During manufacture of the FET-diode arrays, one or more layers (or films) of material are deposited onto the plate, commonly by using a Plasma-Enhanced Chemical Vapor Deposition (PECVD) process in a parallel plate reactor. (A parallel plate reactor contains two plates, namely, (1) the plate upon which the layer is to be formed, and (2) a plate-like electrode, which is positioned nearby. The plate discussed herein, is the plate upon which the layer is to be formed.) The films can be amorphous silicon, silicon dioxide, nitrides of silicon, doped silicon, silicon alloys, or other materials.

The desired thickness is typically in the range of 0.1 micron to 2.0 microns (although sometimes thicknesses in the range of 5 to 10 microns, or even greater, can be used). The Inventor has found that, using the PECVD process in the parallel-plate reactor, the layer tends to be thicker or thinner near the edges of the plate than in the center.

The deviations in thickness can cause problems in later manufacturing steps, such as damage or reduction in feature size due to lateral encroachment, at thin regions when extensive etching is undertaken there. The deviations in thickness can also cause variation in electrical properties of the devices formed at the thin region, compared with the devices formed at other parts of the layer which lack the deviations.

The aforementioned deviations in thickness are caused by one or more of the following factors:

1. A discontinuity in the static or dynamic electric field near the edges of the plate.
2. A temperature gradient near the edges of the plate.
3. A discontinuity, near the edges of the plate, in concentration of the gas from which the layer is deposited.

In addition, the Inventor has found that deviations in thickness occur when a certain type of fixturing device is used to hold the plate in the parallel-plate reactor. Therefore, it would appear that a step, or discontinuity, is implicated in the formation of a deviation or nonuniformity in thickness. The step can take the form of the edge of the fixturing device or the edge of the plate itself.

OBJECTS OF THE INVENTION

Accordingly, it is an object of the invention to provide an improved system for coating plates with films in the range of one-micron in thickness.

It is another object of the invention to provide an improved system for coating plates in a parallel-plate reactor.

It is a further object of the invention to provide a system for reducing variations in thickness of coatings in the one-micron range.

SUMMARY OF THE INVENTION

In one form of the invention, a plate upon which a layer or film is to be deposited is first surrounded by a frame of tiles such that the tiles form a perimeter around the plate. The tile-plate assembly, in effect, moves the edge which is "seen by" (i.e., presented to) the depositing material. The edge thus becomes displaced away from the edge of the plate itself. Consequently, although the thickness variations still occur, as before, they occur at the edge of a tile, instead of at the edge of the plate.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

DETAILED DESCRIPTION OF THE INVENTION

Figure 1A:
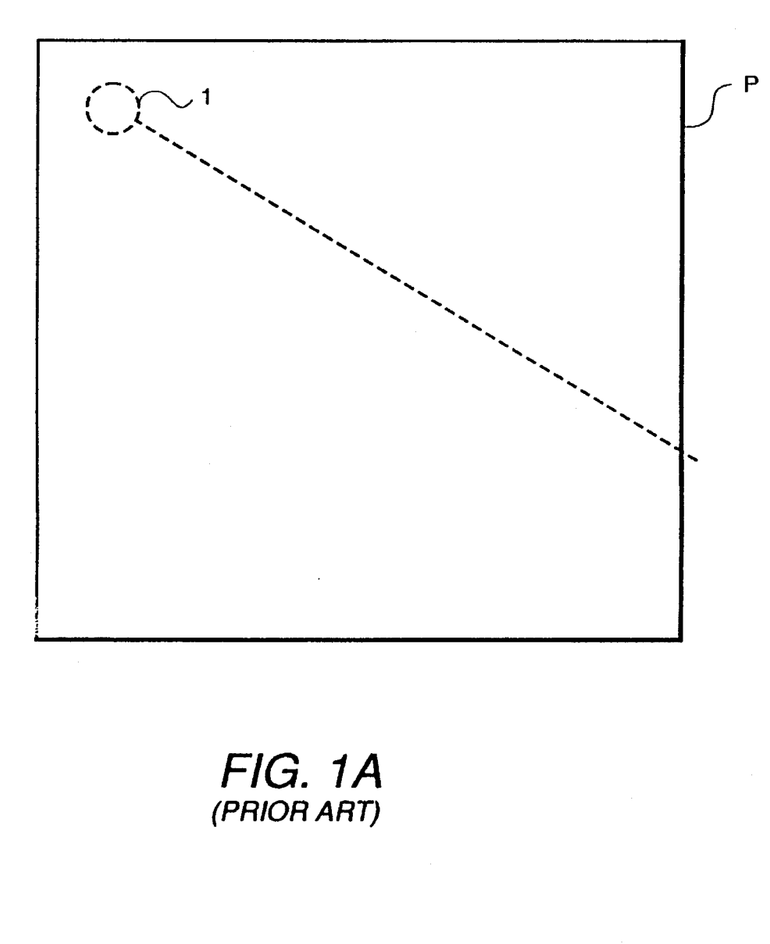
FIG. 1A illustrates a plate for bearing an array of photodiodes and associated switching transistors, with a segment of the plate enlarged in FIG. 1B to show circuitry thereon in schematic diagram form.
Figure 1B:
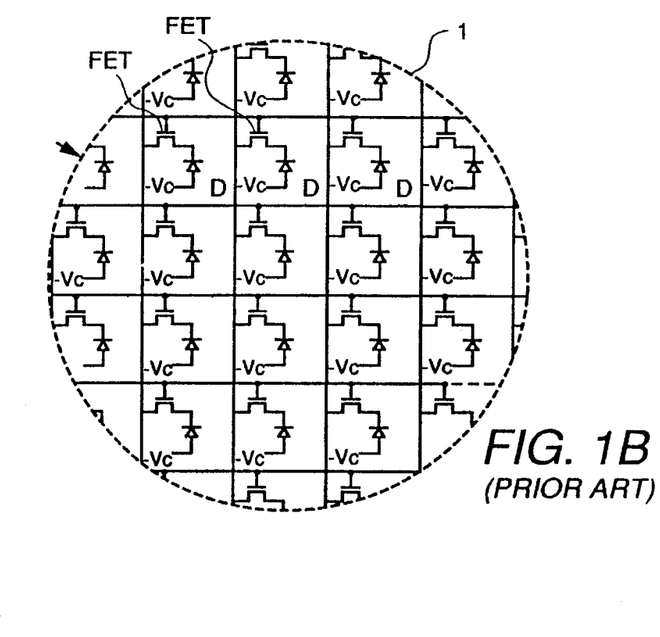

FIGS. 1A and 1B together illustrates a plate P upon which is formed an array of Field-Effect Transistors (FETs), each having an associated photodiode D. For simplicity of illustration, only a portion of the array, contained in a region 1 on plate P, is shown, in schematic form in an enlargement of region 1. Such FET arrays are used, for example, in imaging, while large FET arrays are also used in active-matrix liquid-crystal displays.

Figures 2A, 2B:
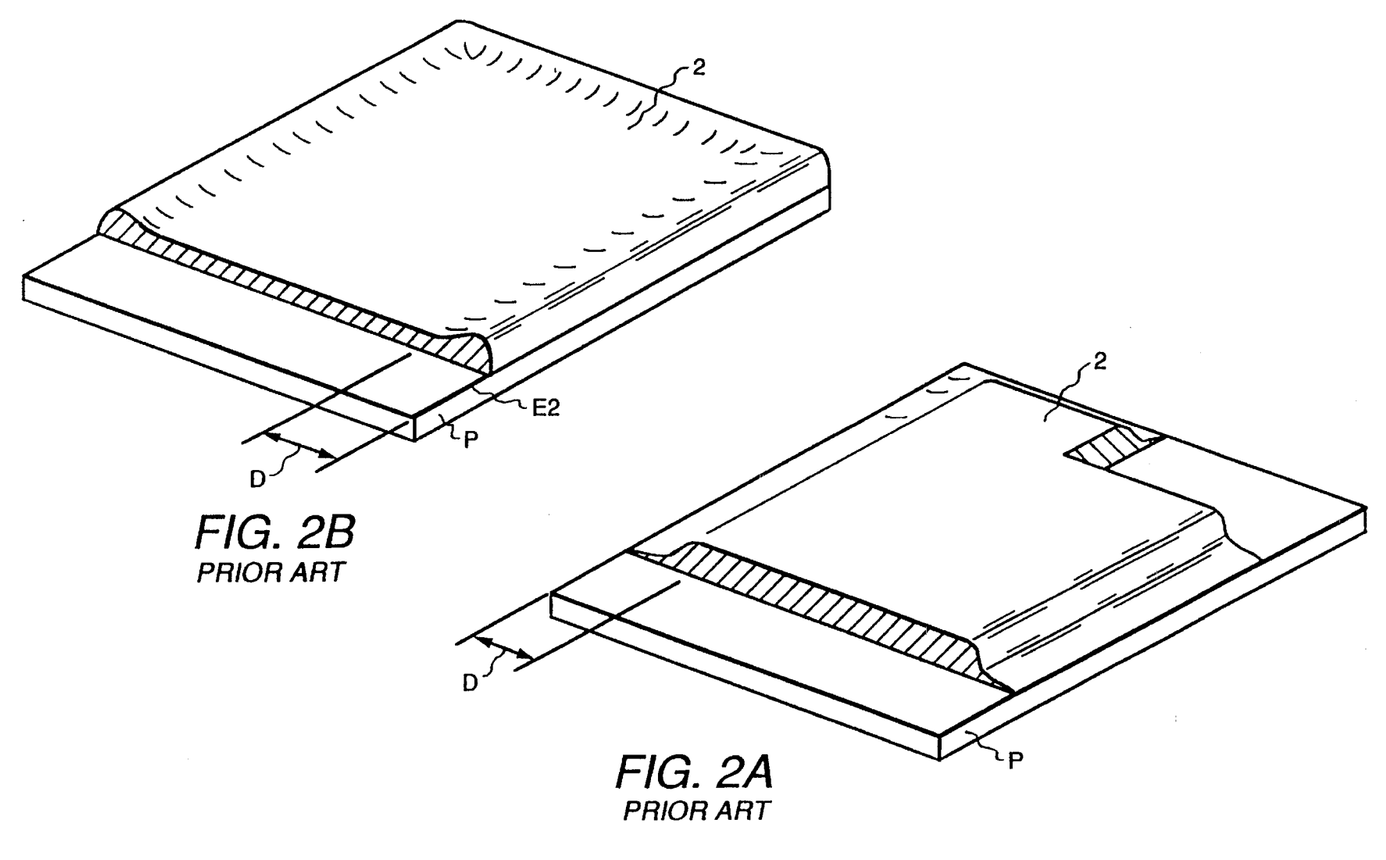
FIGS. 2A and 2B illustrate, in perspective view, coatings carried by the plate of FIG. 1, and which can have THIN EDGES as indicated in FIG. 2A or THICK EDGES, as indicated in FIG. 2B.
Figure 3:
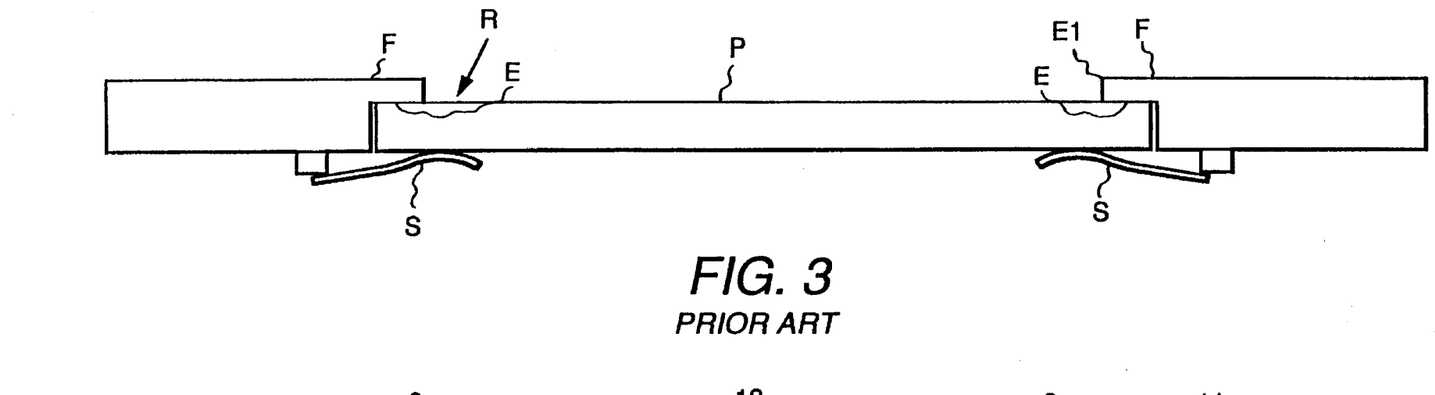
FIG. 3 illustrates, in a simplified side view, a fixturing apparatus for holding the plate of FIG. 1A during deposition of the coating of FIG. 2.

During manufacture of the FET-diode arrays, layers (or films) 2 of silicon, silicon dioxide, nitrides of silicon, doped silicon, silicon alloys, or other materials are deposited onto the plate, commonly by using a PECVD process in a parallel plate reactor. The desired thickness is typically in the range of 0.1 micron to 2.0 microns (although sometimes thicknesses in the range of 5 to 10 microns, or even greater, can be used). Using the PECVD process in the parallel-plate reactor, layer 2 tends to be thinner or thicker near the edges of the plate than in the center, as shown in FIGS. 2A and 2B, respectively, (which are highly exaggerated, to emphasize the deviations). Either of these thickness deviations can cause problems during subsequent manufacturing steps, such as damage or reduction in feature size due to lateral encroachment, at thin regions when extensive etching is undertaken there. The thickness deviations can also cause variation in electrical properties of the devices formed at the thin regions, compared with the devices formed at other parts of the layer which lack the deviations. The thickness deviations occur when a fixturing device of the type shown in FIG. 3 is used to hold the plate in the parallel-plate reactor. The plate P is inserted into the device as shown, and springs S hold the plate in place. A flange F covers the entire edge E of the plate. The deviations occur at regions R. Therefore, a step, or discontinuity, seems to be implicated in the formation of the nonuniformity in thickness. The step can take the form of (a) the edge of the fixturing device shown in FIG. 3, as indicated in FIG. 2A, or (b) the edge E2 of the plate itself, as indicated in FIG. 2B.

Figure 4:
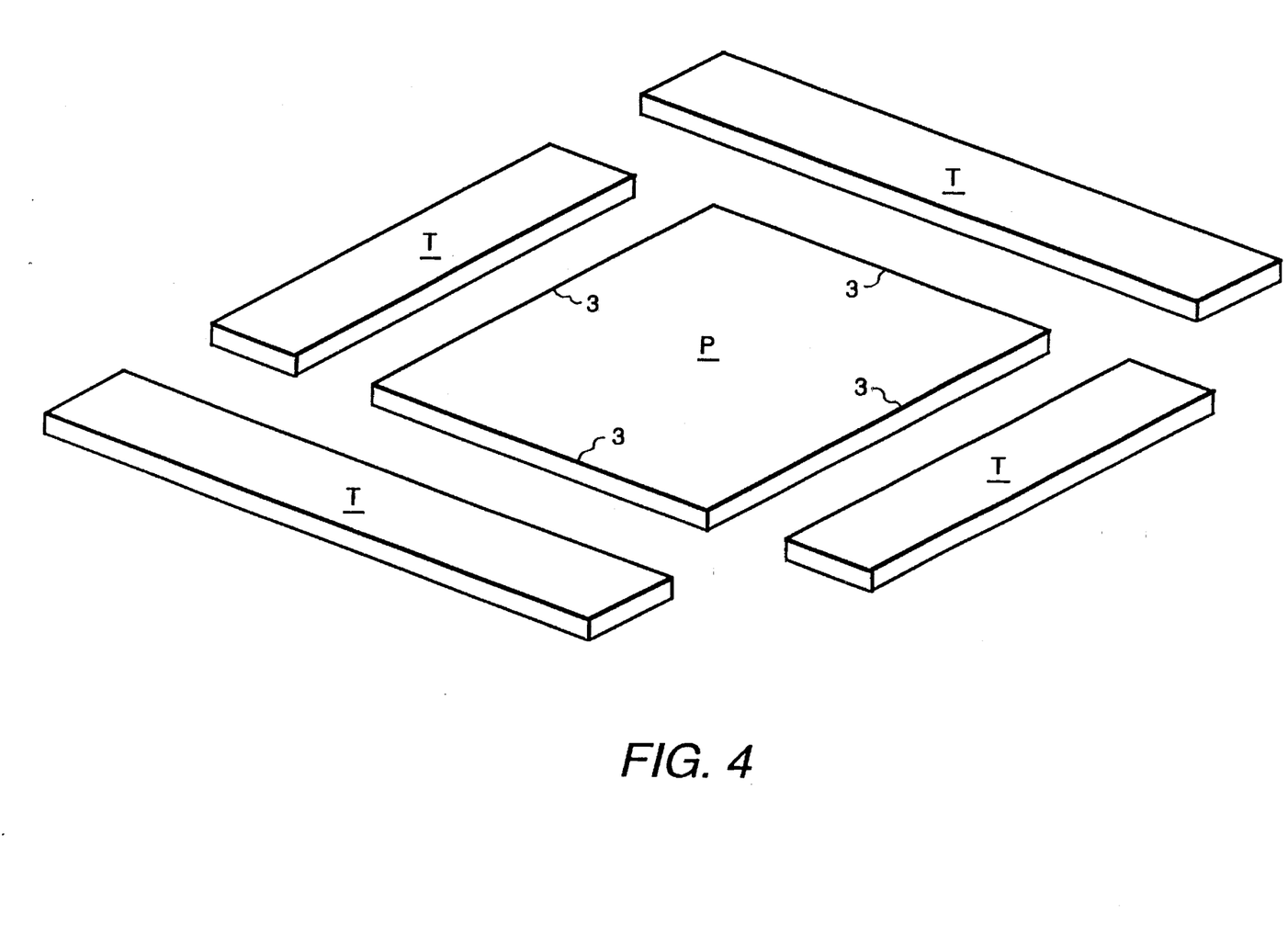
FIG. 4 illustrates one form of the invention, in exploded view.
Figures 5, 11:
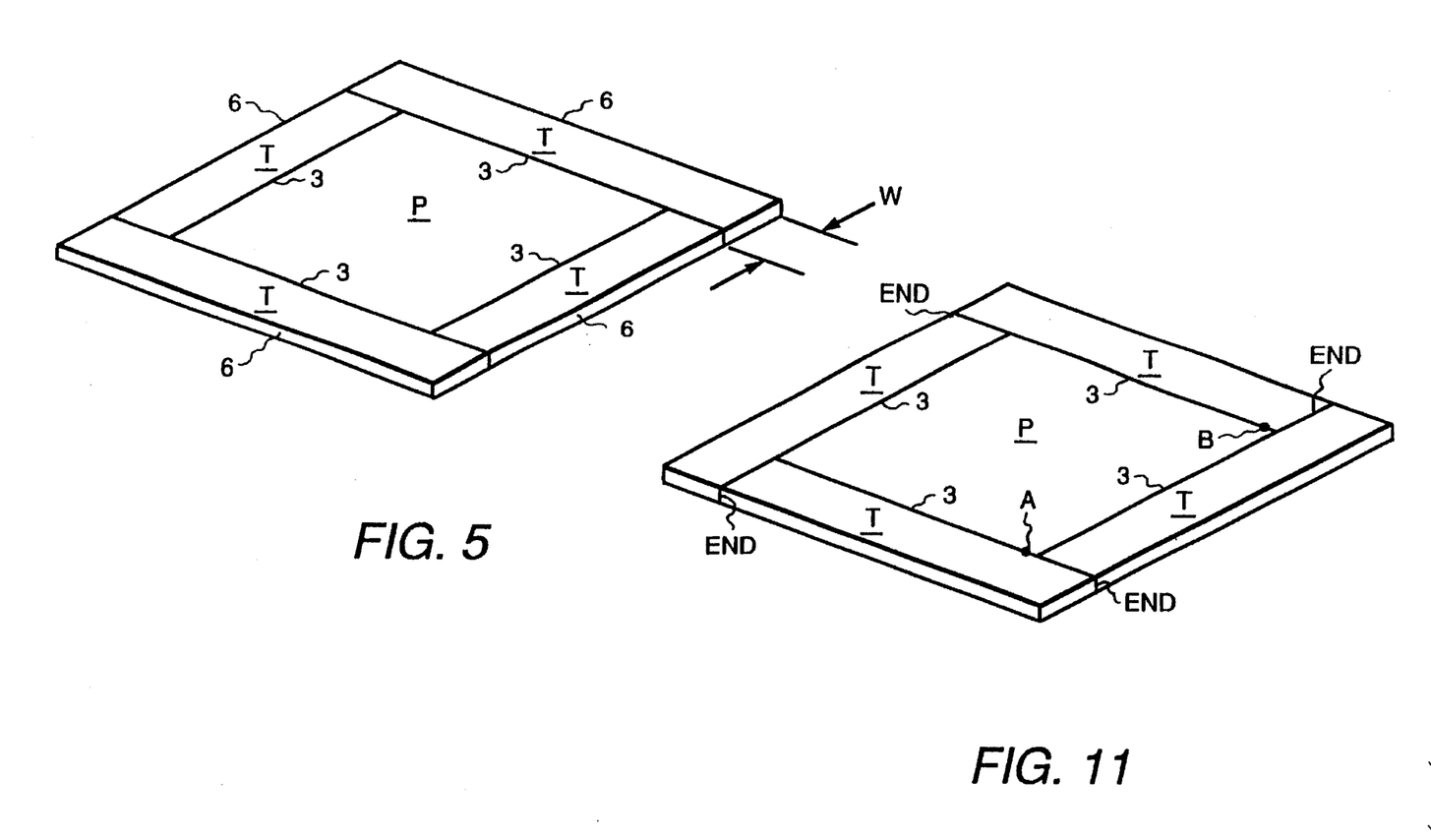
FIG. 5 illustrates, in perspective view, one form of the invention shown in FIG. 4.
FIG. 11 is a perspective view of still another form of the invention.

In FIG. 4, four tiles T are shown in relation to rectangular plate P. In FIG. 5, the four tiles T are shown abutting the edges of rectangular plate P. Plate P is the substrate onto which the layer (or film) is to be deposited by PECVD. The tiles form a frame around the plate. Preferably, the width W of the tiles shown in FIG. 5 is equal to or greater then the distance D in FIGS. 2A and 2B over which the thickness deviation occurs. Preferably, W is about one inch.

The frame formed by tiles T in FIG. 5, in effect, extends the edge of the surface for receiving PECVD deposited material from its previous position 3 outward to the new position 6. That is, the tiles create a surrogate, or sacrificial edge 6, at which the thickness variations in the deposited layer (or film) can occur, but without detrimental effect upon the array to be formed.

Edge 6 is a "surrogate" in the sense that, given that an edge is required to exist, a surrogate edge 6, different from the actual edge 3 of the plate, is provided.

Edge 6 is "sacrificial," in the sense that it is not part of the plate which will carry the transistor-diode array. Any thickness variations occurring near sacrificial edge 6 can be discarded, along with sacrificial edge 6 itself (which is discarded, of course, by discarding the tile of which it is a part). In practice, however, it may be possible to re-use the tiles as frames for several different plates, in different coating operations.

Figure 6:
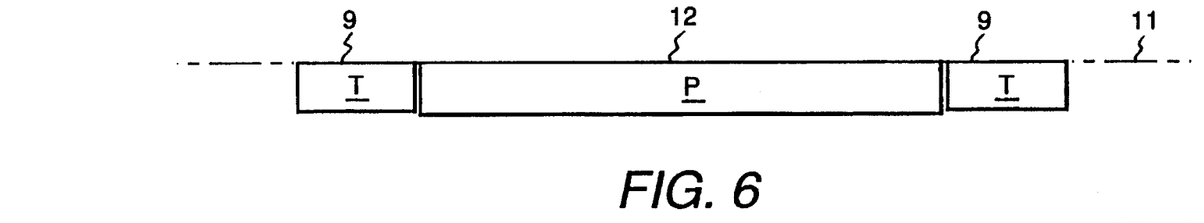
FIG. 6 is a diagrammatic side view illustration of how the surfaces of the tiles of the invention are coplanar with the top surface of the plate of FIG. 1A.
Figure 7:
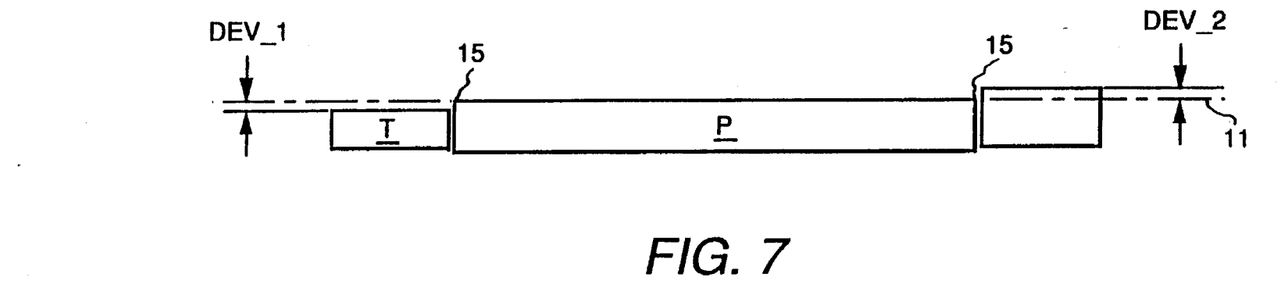
FIG. 7 is a view similar to that of FIG. 6 but illustrating deviations from the coplanar situation of FIG. 6.

As shown in FIG. 6, the tiles are preferably positioned such that their top surfaces 9 are coplanar with the imaginary plane 11 defined by the top surface 12 of plate P. Some deviation from coplanar status can be tolerated, as indicated by spacings DEV_1 and DEV_2 shown in FIG. 7. However, the deviations must not be too large because each deviation itself exposes an edge 15, which can defeat the purpose of using the tiles.

As to the allowable amount of deviation, the thickness of the tiles should be the same nominal thickness as that of plate P. For example, one type of plate P has a nominal thickness of 0.040 inch (i.e., 40 mils). However, the manufacturer states that the actual thickness can range from 0.036 to 0.044 inch so that the actual thickness can deviate by ±0.004 inch from the nominal of 40 mils. Tile thickness is preferably within this same range; that is, for a plate P having nominal thickness of 40 mils and deviation of ±0.004 inch, the tiles preferably have the same nominal thickness and the same deviation.

The tiles are preferably constructed of the same material as plate P itself. For example, if plate P is comprised of glass, the tiles should also be comprised of glass, and preferably glass of the same type. However, aluminum tiles, as opposed to glass tiles, have been found to provide good uniformity when plate P is comprised of glass. In general, the tile material should be compatible with vacuum systems which reach elevated temperatures of 250° C.

Figure 8:
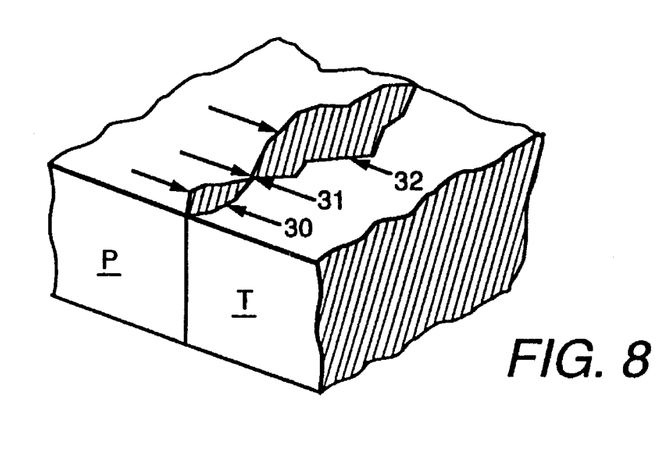
FIG. 8 illustrates, in perspective view, microscopic gaps at the junction between the plate and a tile.

At the microscopic level, the edges of both plate P and tiles T are rough, as shown in FIG. 8. These rough edges, when mated together, form minute gaps 30,32 since they make contact at their high points 31 only. However, the existence of these gaps is of no consequence to the invention. In general, plate P and tiles T should be in good mechanical contact, and gaps of up to about 0.1 mm can be tolerated.

Figure 9:
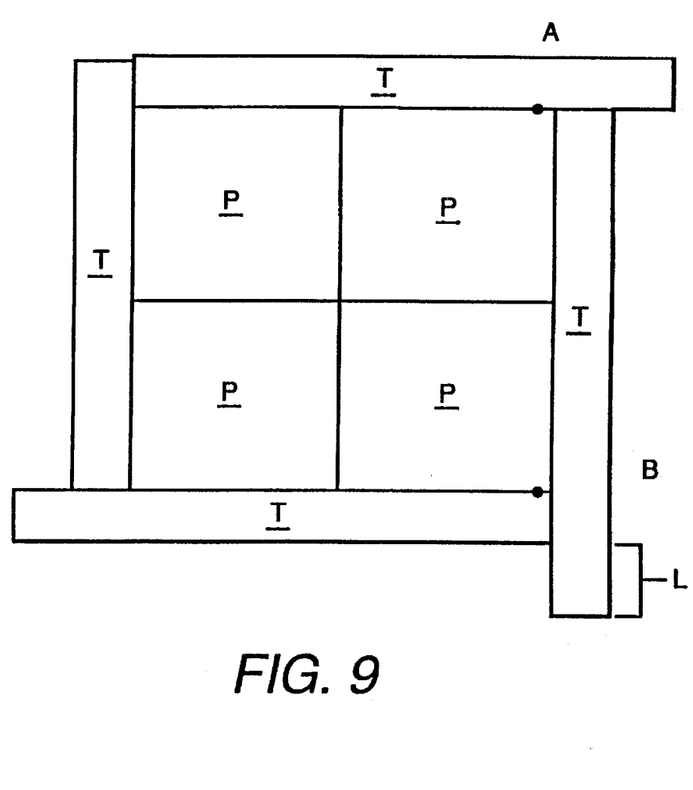
FIGS. 9 is a plan view illustration of another form of the invention.

It was presumed above that a single plate is framed by tiles. Alternatively, however, multiple plates P can be abutted together, as shown in FIG. 9. In such event, where the plates are arranged to abut each other (with gaps no greater than about 0.1 mm resulting from edge roughness), each plate assumes the function of a tile by extending the surface to be coated. However, by arranging tiles T so as to frame the arrangement of plates P, the tiles perform the same function as previously stated, acting as a surrogate edge for the tile arrangement. Thus the entire arrangement of plates P is coated with good uniformity, leaving thickness variations in the coating only upon tiles T.

It may be preferable to arrange the tiles as shown in FIG. 11, as opposed to the arrangement shown in FIG. 5. In FIG. 11, each tile has one end (END) which is co-terminal with an edge 3. In the FIG. 5 arrangement, such is not the case.

In the FIG. 11 arrangement, the lengths of tiles T are unimportant (provided the tile has the minimum length necessary to span the interior of the frame; e.g., from point A to point B). The reason is that any excess length, such as length L indicated in FIG. 9, is simply not used. The excess length L does not interfere with forming the frames.

Figure 10:
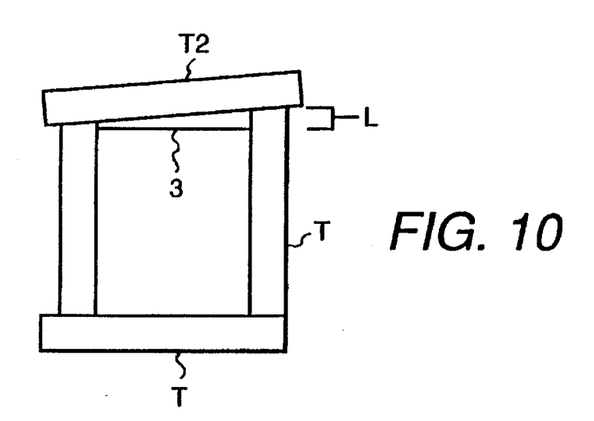
FIG. 10 is a plan view illustrating a problem which can occur in the embodiment of FIG. 5.

In the FIG. 5 embodiment, however, excess length cannot be tolerated, as is apparent in FIG. 10. The excess length L interferes with the abutment of tile T2 against edge 3, as shown in FIG. 10. With this restriction on length, the arrangement of FIG. 5 may require more expensive tiles since it may be more difficult to manufacture the "restricted-length" tiles, which exactly meet a certain length requirement. In contrast, therefore, the arrangement of FIG. 11 may be more economical.

It may be preferable to frame a plate P with aluminum tiles T of the type shown in FIG. 11. Aluminum tiles provide the advantage of ease of manufacture; e.g., they can be cut using a shear. Moreover, it is not necessary that the frame be constructed of discrete tiles. Instead, the frame can be comprised of a rectangular ring which surrounds the plate.

Figure 12:
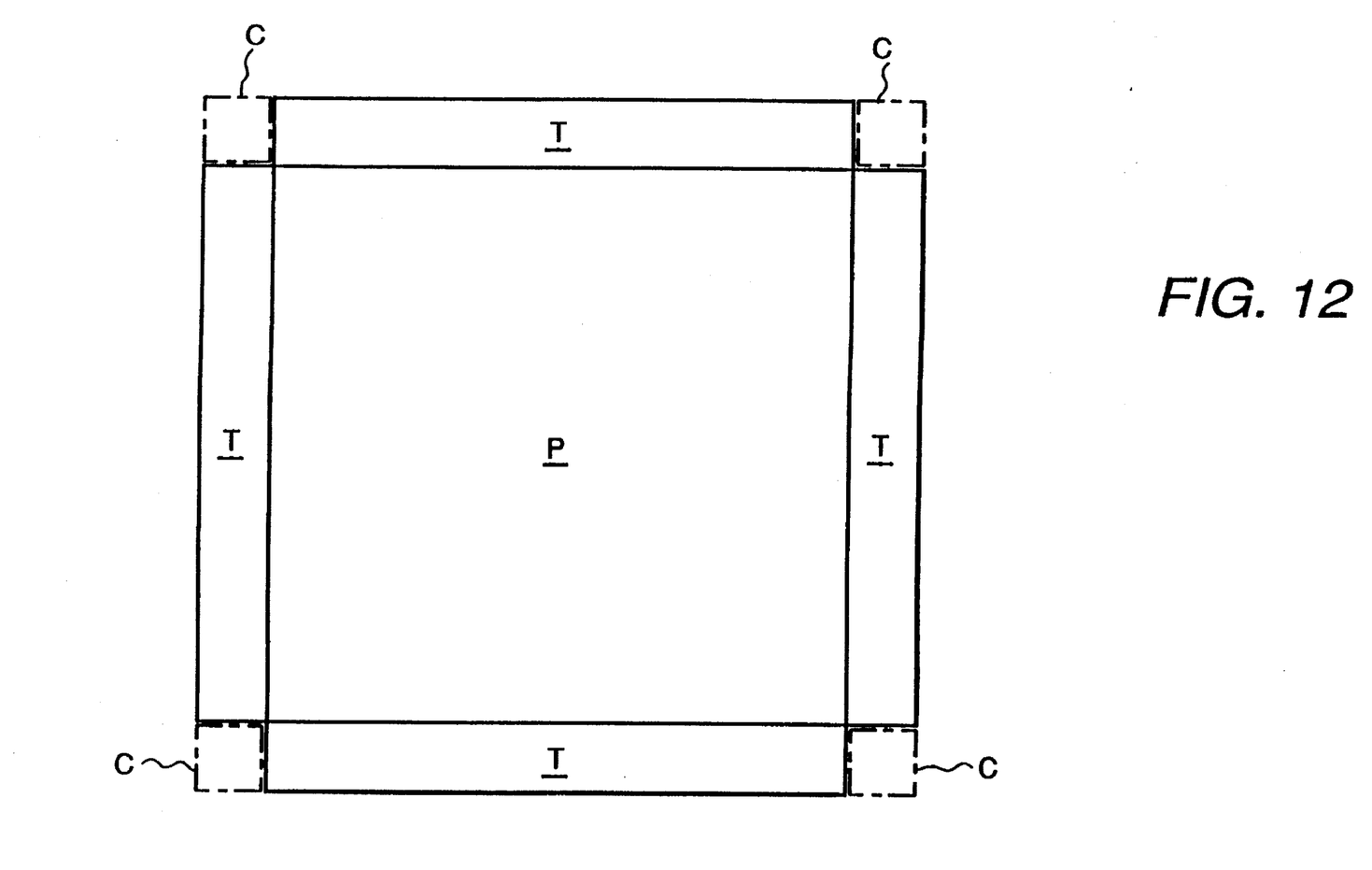
FIG. 12 is a plan view of yet another form of the invention.

An alternative arrangement of the tile-frame structure is shown in FIG. 12. Each tile T is as long as the edge against which it abuts, and no longer; that is, the tiles are coextensive with their respective edges. This arrangement is based on the concept that a tile influences the film thickness at an edge of the plate P which the tile T abuts. Since the tile sections that would otherwise occupy the corner regions C would not abut any edges of the plate, these missing sections should have no significant influence on film thickness.

Plate P shown in FIG. 4 will become "fully" covered by the PECVD film (not shown) to be deposited thereon, while plate P shown in FIG. 3 will not be since regions of the plate will be shielded against deposition by flange F and thus will remain largely free of the coating film. That is, the top surface of the plate shown in FIG. 4 is "fully exposed" to the depositing material while the plate shown in FIG. 3 is not "fully exposed."

Tiles T shown in FIGS. 4 and 5 form "lateral extensions" of the surface of the plate. They are "lateral" because, as shown in FIG. 6, they extend in plane 11 defined by the top surface of plate P.

Plasma-enhanced chemical vapor deposition (PECVD) is an atom-by-atom deposition process, and should not be confused with other, different processes. For example, in spray painting, the paint which is deposited consists of droplets. Each droplet contains millions or billions of atoms (or molecules). Spray painting is not an atomic deposition process since massive groups of atoms rather than single atoms are deposited with each droplet.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

I claim:

1. For insertion into a plasma-enhanced chemical vapor deposition chamber, apparatus comprising:

a) an arrangement of glass plates, each of said plates having a surface to be coated and having at least one edge abutting against one edge of at least one other of said plates; and b) a frame of glass tiles abutting against the peripheral edges of said arrangement of glass plates.

2. The apparatus of claim 1 wherein said frame comprises a plurality of lateral extensions of said plates, each of said lateral extensions abutting against an edge of at least one of said plates.

3. The apparatus of claim 1 wherein each of said plates is of rectangular shape.

4. The apparatus of claim 2 wherein each of said plates is of rectangular shape.

5. For insertion into a plasma-enhanced chemical vapor deposition chamber, an assembly comprising:

a) a rectangular plate comprised of glass having a surface to be coated; and b) a frame surrounding the plate and comprising four lateral extensions of said plate, each of said extensions being comprised of aluminum and abutting a respective edge of said plate, said frame having an upper surface substantially coplanar with that of the plate so as to substantially avoid electric field discontinuities near said edges.

* * * * *

UNITED STATES PATENT AND TRADEMARK OFFICE
CERTIFICATE OF CORRECTION

PATENT NO. : 5,490,881
DATED : February 13, 1996
INVENTOR(S) : Robert F. Kwasnick It is certified that error appears in the above-indentified patent and that said Letters Patent is hereby corrected as shown below:

On the title page, item [73]: should read;

Assignee: General Electric Company
Schenectady, N.Y.

Signed and Sealed this

Thirtieth Day of July, 1996

Attest:

BRUCE LEHMAN

*Attesting Officer*  *Commissioner of Patents and Trademarks*